United States Patent
Cheng et al.

(10) Patent No.: US 9,741,717 B1
(45) Date of Patent: Aug. 22, 2017

(54) FINFETS WITH CONTROLLABLE AND ADJUSTABLE CHANNEL DOPING

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/289,374

(22) Filed: Oct. 10, 2016

(51) Int. Cl.
*H01L 21/8238* (2006.01)
*H01L 27/088* (2006.01)
*H01L 21/8234* (2006.01)
*H01L 29/66* (2006.01)
*H01L 21/02* (2006.01)

(52) U.S. Cl.
CPC .... *H01L 27/0886* (2013.01); *H01L 21/02164* (2013.01); *H01L 21/02274* (2013.01); *H01L 21/823431* (2013.01); *H01L 21/823481* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 8,178,409 B2 | 5/2012 | Xiao et al. | |
| 8,525,271 B2 | 9/2013 | Gregory et al. | |
| 8,629,016 B1 | 1/2014 | Hoffmann et al. | |
| 8,785,286 B2 | 7/2014 | Tsai et al. | |
| 9,082,853 B2 | 7/2015 | Cheng et al. | |
| 9,105,559 B2 | 8/2015 | Basker et al. | |
| 9,287,180 B2 | 3/2016 | Liu et al. | |
| 9,343,371 B1 | 5/2016 | Wu et al. | |
| 2014/0103437 A1 | 4/2014 | Kapoor et al. | |
| 2014/0319623 A1* | 10/2014 | Tsai | H01L 21/823462 257/401 |
| 2015/0295087 A1 | 10/2015 | Cheng et al. | |

FOREIGN PATENT DOCUMENTS

WO     2014062586 A1     4/2014

* cited by examiner

*Primary Examiner* — Cory Eskridge
(74) *Attorney, Agent, or Firm* — Cantor Colburn LLP; Vazken Alexanian

(57) ABSTRACT

A method of forming features of a finFET structure includes forming fins on a surface of a substrate. A first liner is formed around each fin and a shallow trench isolation region is formed around each fin. A dopant layer is implanted in each fin. A portion of the shallow trench isolation region is etched from each fin. A first portion of the structure is blocked and the first liner replaced with a second liner in a second portion of the structure.

17 Claims, 12 Drawing Sheets

FINFETS WITH CONTROLLABLE AND ADJUSTABLE CHANNEL DOPING

BACKGROUND

The present invention relates in general to fabricating semiconductor devices and resulting structures, and more specifically relates to a fabrication method and resulting structure for a fin-type field effect transistor (finFET) structure having adjustable and controllable channel doping.

FinFET devices are nonplanar structures that can be built on a semiconductor on insulator (SOI) substrate. A typical configuration of a finFET device includes a vertical semiconductor fin having a single or double gate wrapped around the fin. The portion of the fin that is under the gate functions as the finFET channel. In an effort to provide continued scaling of semiconductor structures to continuously smaller dimensions while maintaining or enhancing semiconductor device performance, the design and fabrication of semiconductor fin structures have evolved.

SUMMARY

According to an embodiment of the present invention, a method of forming features of a finFET structure includes forming fins on a surface of a substrate. A first liner is formed around each fin and a shallow trench isolation region is formed around each fin. A dopant layer is implanted in each fin. A portion of the shallow trench isolation region is etched from each fin. A first portion of the structure is blocked, and the first liner is replaced with a second liner in a second portion of the structure.

According to an embodiment of the present invention, a finFET structure includes a plurality of fins located on a surface of a substrate. The finFET structure includes a first liner disposed around each fin in a high threshold voltage region of the structure, with a dopant layer implanted into each fin. The finFET structure includes a second liner disposed around each fin in a low threshold voltage region of the structure, with a dopant layer implanted into each fin. The first liner and the second liner include different materials.

According to an embodiment of the present invention, a method of forming features of a finFET structure includes forming fins on a surface of a substrate. A first liner formed from nitride is formed around each fin. A shallow trench isolation region is formed around each fin. A fin is removed from the structure. A dopant layer is implanted in each fin. A portion of the shallow trench isolation region is etched from each fin. A high threshold voltage region of the structure is blocked and the first liner is replaced with second liner formed from an oxide in a low threshold voltage region of the structure. A dummy gate and spacers are formed over a fin. A source/drain epitaxy is performed to form the finFET structure.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
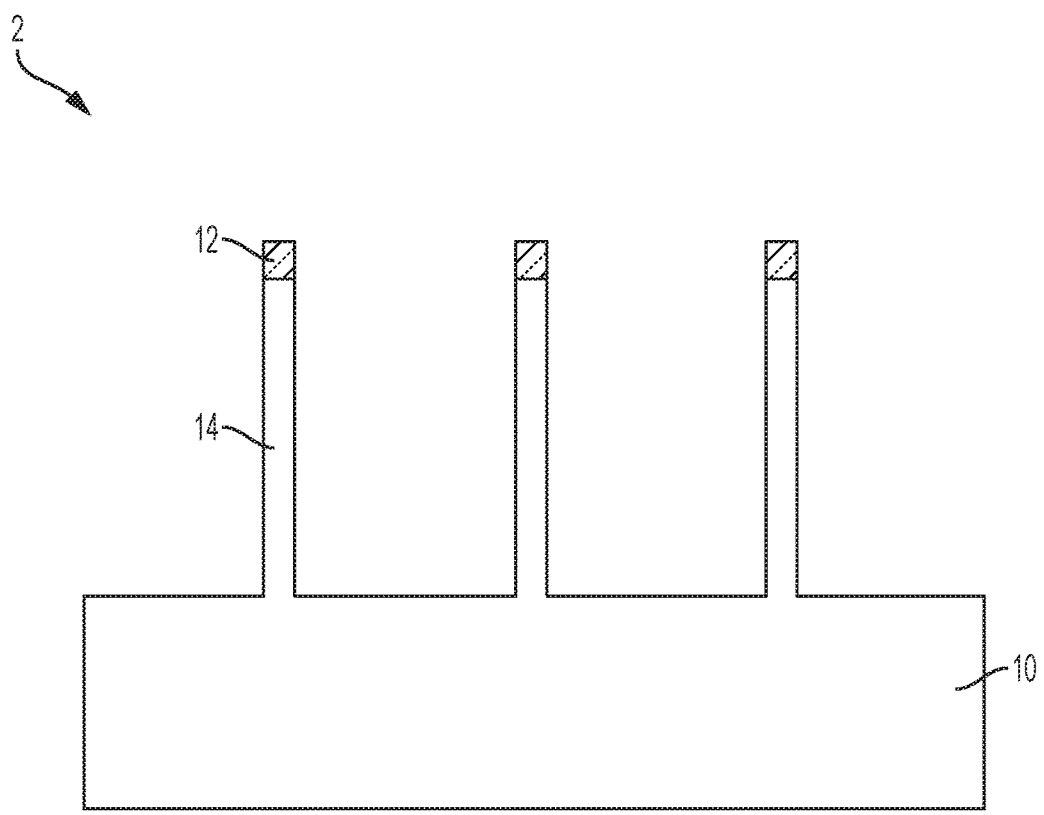
FIG. 1 is a cross-sectional illustration of a finFET structure after an initial fabrication operation according to embodiments of the present invention.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments described herein will now be provided. Although specific fabrication operations used in implementing one or more embodiments described herein can be individually known, the described combination of operations and/or resulting structures described herein are unique. Thus, the unique combination of the operations described herein utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present invention, a field effect transistor (FET) is a transistor using an electric field to control the shape and electrical conductivity of a channel using a type of a charge carrier in a semiconductor. Field effect transistors can have several forms, but all are known to have high input impedance (i.e., the measure of the opposition that a circuit presents to a current when a voltage is applied). The conductivity of a field effect transistor is regulated by the input current (i.e., emitter to base current) and so has low input impedance. A field effect transistor's conductivity is regulated by a voltage applied to a terminal (e.g., a gate) which is insulated from the device. The applied gate voltage imposes an electric field into the device, which then attracts or repels charge carriers to or from the region between a source terminal and a drain terminal. The density of charge carriers influences conductivity levels between the source terminal and the drain terminal. The size or length of the gate is the distance between the source terminal and the drain terminal. The width of the gate is generally defined as the extension of the transistor, in the direction perpendicular to the cross-section of the field effect transistor. Generally, the width is larger than the length of the gate.

Field effect transistors have high gate to main current resistance, greater than or equal to 100 MegaOhms which means that they can provide a high degree of isolation between control and flow. A field effect transistor generally generates less noise than a bipolar junction transistor because base current noise increases with shaping time. Field effect transistors can thus find use in sensitive electronics such as tuners and low-noise amplifiers for very high frequency (VHF) and satellite receivers. Field effect transistors are also relatively immune to radiation, exhibit no offset voltage at zero drain current and thus make an excellent signal chopper. Field effect transistors also generally have better thermal stability than a bipolar junction transistor because there is no additional power draw once the gate is opened or closed because field effect transistors are controlled by gate charge. Such a feature allows low-power switching, which allows greater miniaturization of circuits because heat dissipation needs are not as great.

Field effect transistors have low gain bandwidth product compared to bipolar junction transistors. Field effect transistors also have a very low "on" resistance and a very high "off" resistance. The intermediate resistances are significant so that field effect transistors can dissipate large amounts of power while switching. Switching quickly can cause transients that can excite stray inductances and generate significant voltages that can couple to the gate and cause unintentional switching. Field effect transistors can therefore require a very careful layout and can involve compromises between switching speed and power dissipation. There can also be compromises between voltage ratings and "on" resistance wherein high threshold voltage field effect transistors have a relatively high "on" resistance and thus, conduction losses as well.

Turning now to an overview of aspects of the present subject matter, one or more embodiments provide methods and structures that enable finFETs to be made with controllable and adjustable channel doping using the unique and surprising feature that dopants segregate differently at different semiconductor/dielectric interfaces.

Punch through stop (PTS) doping is needed below active fins for finFET isolation. The mostly used schemes for PTS doping are "late-well implant" and "super steep retrograde well" (SSRW). The late-well implant scheme implants PTS dopants after fin formation, which induces high channel doping. The SSRW implant scheme implants PTS dopants before channel epitaxy. Although it starts with the steep retrograde well, due to the downstream thermal budget, and especially due to the needed thermal budget for shallow trench isolation densification, the PTS dopants would up-diffuse into the channel. The methods and structures described herein make finFETs with controllable and adjustable channel doping. It was surprisingly found that the dopants could segregate into a low-quality oxide layer (e.g., a plasma enhanced chemical vapor deposition oxide layer, a chemical vapor deposition oxide layer, a physical vapor deposition oxide layer) under a low thermal budget (e.g., less than or equal to 800° C.). Such a low-quality oxide layer can be used to control and adjust the channel doping for the finFETs.

FinFETs generally includes a lateral fin channel, a metal gate, a spacer, and a source/drain (S/D). The channel can include fins with a controllable and adjustable doping level. The metal gate can clad around the fin channel. The spacers can clad around the fins against (left and right) the metal gate. The S/D can connect the fins at the S/D region.

According to aspects of the present invention, a method for making finFETs with controllable and adjustable channel doping via selective dopants drive-out annealing includes forming fins on the substrate. The nitride hardmask is kept on top of the fins. A first liner, e.g., a conformal nitride liner, is deposited around the fins. A shallow trench isolation (STI) is formed (e.g., using chemical mechanical polishing (CMP)) on the nitride liner. A directional etching process is performed to etch unwatched fins from the substrate. Implantation is performed to form the PTS doping and optionally the well-isolation doping if not performed previously. Then, the active portion of the fins is revealed by etching the STI. Afterward, the high threshold voltage (Vt) region is blocked. The nitride liner can then be replaced in the low Vt region with low-quality conformal plasma enhanced chemical vapor deposition oxide. The dummy gate (poly-silicon) and spacers can then be formed. Source/drain epitaxy can then be formed, and the drive-out annealing dopant is performed. This process drives out the dopants from the active fins in the low Vt region to the oxide liner. A replacement metal gate is then formed and downstream processes performed.

According to aspects of the invention, a method of making a finFET structure includes forming fins on a surface of a substrate and then forming a first liner around each fin. A shallow trench isolation region can then be formed around each fin and a dopant layer implanted in each fin. A portion of the shallow trench isolation is then etched from each fin forming a channel. A first portion of the structure is blocked and the first liner is replaced with a second liner in a second portion of the structure. A dummy gate and spacers are formed over a fine and a source/drain epitaxy is performed forming the finFET structure. Various other downstream processes can then be performed to further modify the finFET structure.

The first and second liners are made from a different material. For example, the first liner is made from a nitride, a nitrided oxide or other dielectric materials that have a low dopant segregation coefficient and the second liner is made from an oxide, for example, silicon dioxide. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The second liner is formed onto the structure by a number of methods including, but not limited to atomic layer deposition (ALD), chemical vapor deposition (CVD), plasma deposition, physical vapor deposition (PVD), or a combination including at least one of the foregoing. For example, the method of forming the second liner onto the structure is plasma enhanced chemical vapor deposition (PECVD). The first portion of the structure can include a high threshold voltage (Vt) region of the structure, while the second portion of the structure can include a low threshold voltage region of the structure.

Another method of making a finFET structure can include forming fins on a substrate and forming a nitride liner around each fin. A shallow trench isolation region is formed around each fin and then a fin is removed from the structure. A dopant layer is implanted in each fin and a portion of the shallow trench isolation region is etched from each fin. A high threshold voltage region of the structure is blocked and the nitride liner replaced with an oxide liner in a low threshold voltage region of the structure. A dummy gate and spacers are formed over a fin and a source drain epitaxy is performed to form the finFET structure.

The method can further include annealing the structure after the source/drain epitaxy to drive the dopants in the dopant layer into the second liner. The annealing is at a temperature of less than or equal to 900° C. After annealing, the dummy gate is stripped from the structure along with the first liner and/or the second liner. A replacement metal gate (RMG) is formed on the structure and downstream processes conducted.

A finFET structure with controllable and adjustable channel doping can include a plurality of fins located on a surface of a substrate, a first liner disposed around each fin in a high threshold voltage region of the structure, with a dopant layer implanted into each fin. A second liner is disposed around each fin in a low threshold voltage region of the structure, with a dopant layer implanted into fin. The first liner and the second liner are made from different materials as previously described herein, with the first liner being made from a nitride and the second liner being made from an oxide, e.g., silicon dioxide. The second liner can include dopants from the dopant layer. An upper portion of the fins in the first region can include a substantially low concentration of dopants from the dopant layer. The term "substantially low concentration" as described herein generally refers to less than or equal to $1 \times 10^{17}/(cm^3)$ dopants present in the upper portion of the fins in the first region.

With reference now to FIG. 1, a structure 2 is illustrated with a substrate 10 following a lithographic patterning and etching process that forms fins 14. A hardmask layer 12 is arranged on the substrate 10. The hardmask layer 12 can include, for example, silicon oxide, silicon nitride (SiN), SiOCN, SiBCN or any suitable combination of those. The hardmask 12 is deposited using a deposition process, including, but not limited to, PVD, CVD, PECVD, or any combination thereof.

The fins 14 are formed by, for example, a photolithographic patterning and etching process such as reactive ion etching process that patterns a resist on the hardmask 12 and removes exposed portions of the hardmask 12 and the substrate 12 to form the fins 14.

Non-limiting examples of desirable materials for the substrate 10 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Figure 2:
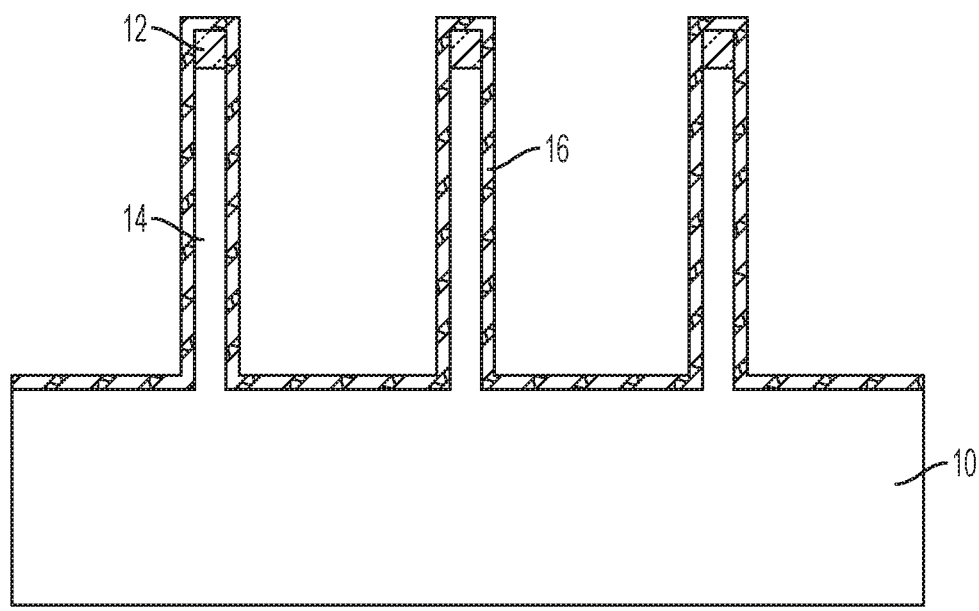
FIG. 2 is a cross-sectional illustration of the finFET structure of FIG. 1 with a first liner disposed around the fins according to embodiments of the present invention.
Figure 3:
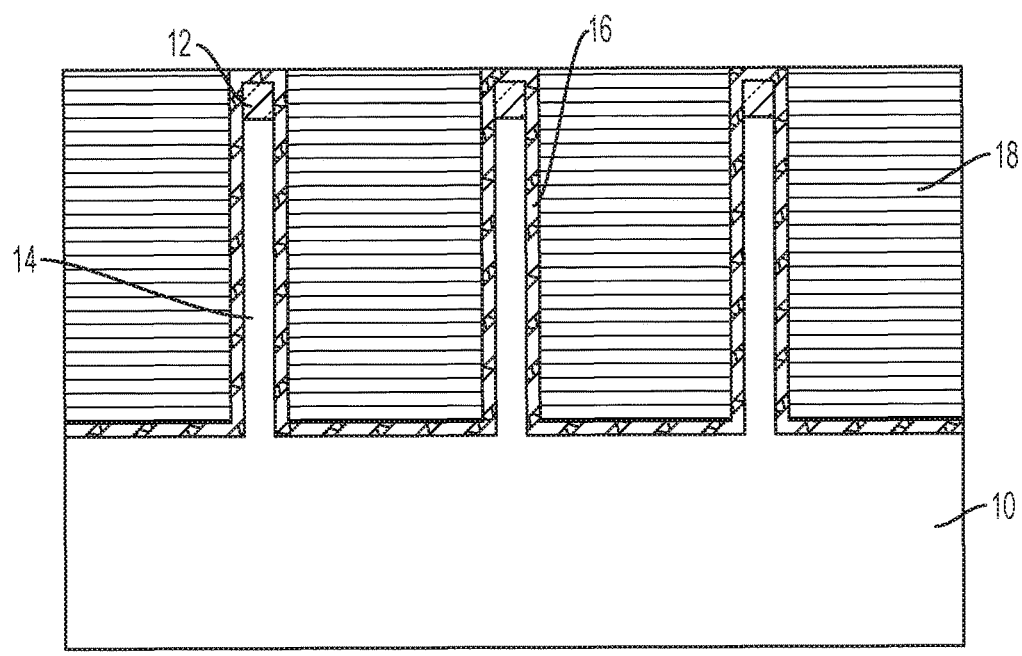
FIG. 3 is a cross-sectional illustration of the finFET structure of FIG. 2 with a shallow trench isolation region formed around the first liner according to embodiments of the present invention.

In FIG. 2, a first liner 16 has been deposited around the substrate 10. The first liner 16 can include a nitride liner, e.g., a conformal nitride liner. In FIG. 3, the structure 2 is shown after formation of a shallow trench isolation (STI) region 18 adjacent to the fins 14. The STI region 18 is formed by, any process including, for example, lithography or etching to form trenches, and then filling the trenches with an insulating material, such as silicon dioxide.

In the illustrated embodiment, at least one isolation region is a shallow trench isolation region ("STI"). However, the isolation region 18 is a trench isolation region, a field oxide isolation region (not shown), or any other type of isolation region. The isolation region 18 provides isolation between neighboring gate structure regions, and is used when the neighboring gates have opposite conductivities, e.g., nFETs and pFETs. As such, the isolation region 18 can separate an nFET device region from a pFET device region.

Figure 4:
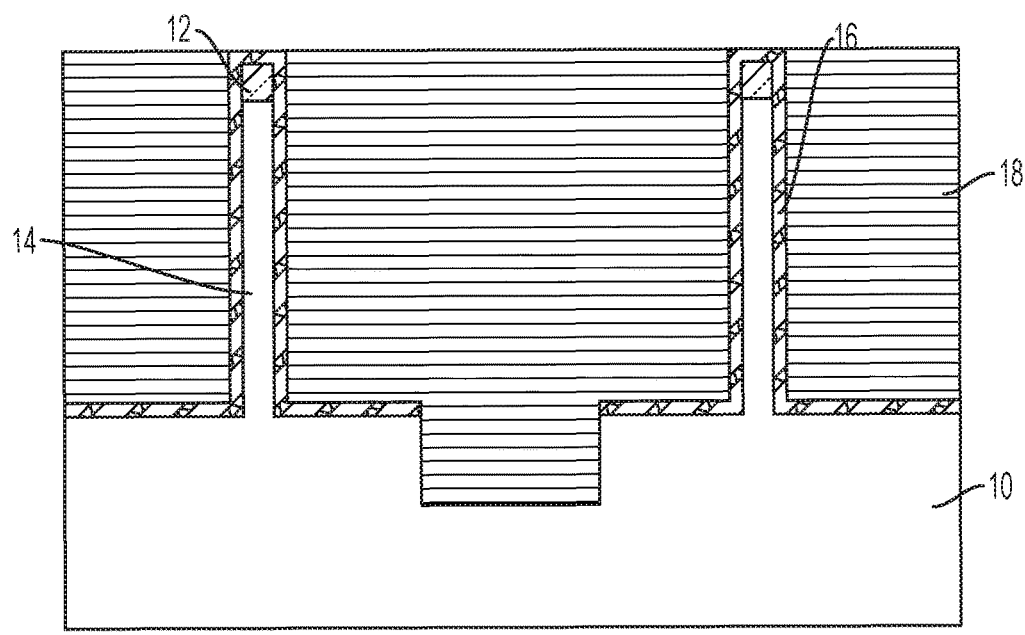
FIG. 4 is a cross-sectional illustration of the finFET structure of FIG. 3 with any unwanted fins removed from the finFET structure according to embodiments of the present invention.
Figure 5:
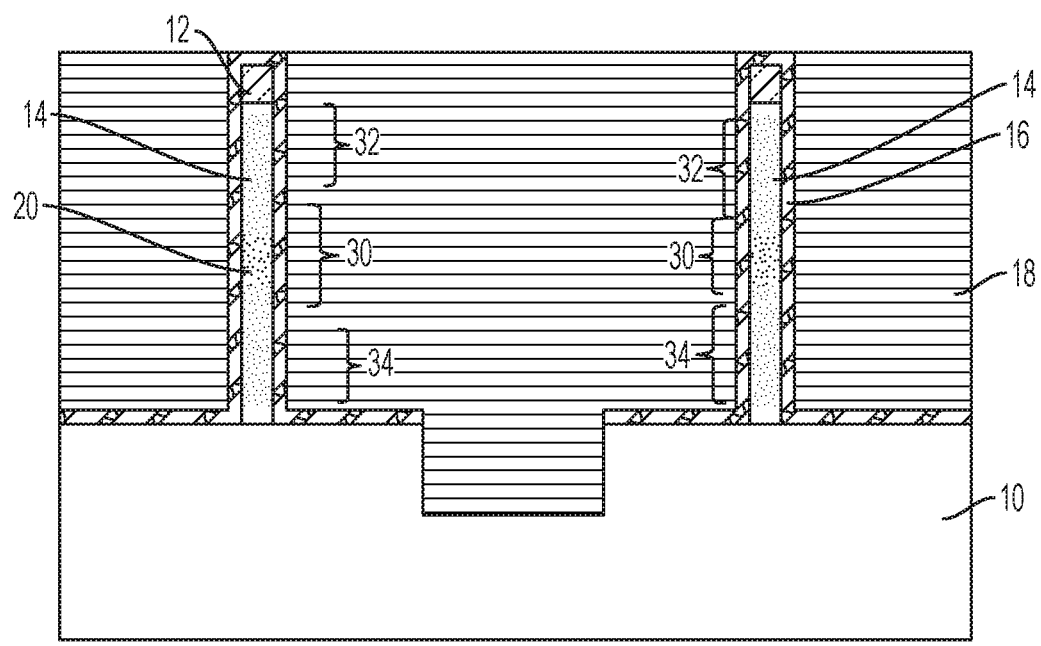
FIG. 5 is a cross-sectional illustration of the finFET structure of FIG. 4 with punch through stopper dopants implanted into each fin according to embodiments of the present invention.
Figure 6:
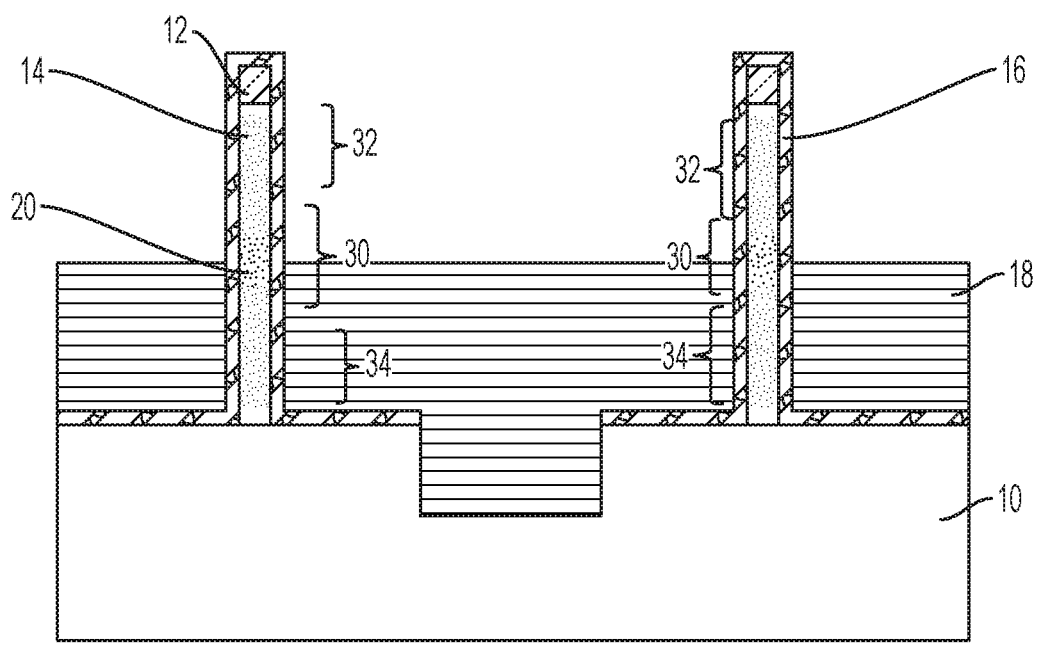
FIG. 6 is a cross-sectional illustration of the finFET structure of FIG. 5 after a portion of the shallow trench isolation has been etched away from the fins according to embodiments of the present invention.
Figure 7:
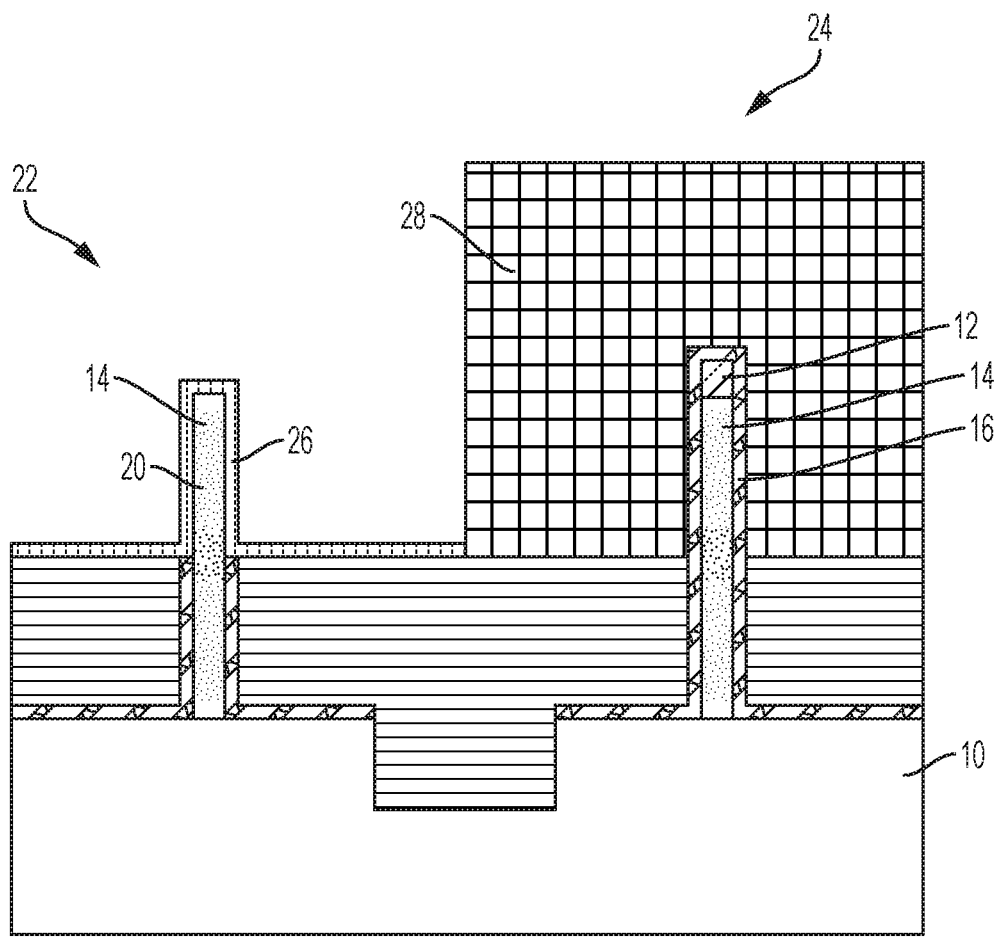
FIG. 7 is a cross-sectional illustration of the finFET structure of FIG. 6 with a high threshold region of the finFET structure blocked according to embodiments of the present invention.

Turning now to FIG. 4, the structure 2 of FIG. 3 is illustrated after removal of a non-wanted fin 14 from the substrate 10 has been completed. In FIG. 5, punch through stopper dopants 20 are being implanted into the fins 14. As can be seen in FIG. 5, the punch through stopper dopants 20 and optionally well-isolation dopants if they have not been added to the structure previously are implanted into the entire fins 14, with the highest concentration of dopants being in a middle portion 30 of the fins 14 and a lower concentration of dopants being present in a top portion 32 and a bottom portion 34 of the fins 14. Punch through stopper dopants 20 are desirable below the fin channel to prevent leakage after formation of the structure 2.

Following the implantation of the punch through stopper dopants 20, an etching process, such as, for example, a reactive ion etching process is performed to remove portions of the shallow trench isolation region 18 and reveal the active portion of the fins 14. Following the fin reveal etching process, a high threshold region 24 of the structure 2 is blocked with photoresist 28 or optionally, other dummy electric materials that can be selectively removed later, while the low threshold region 22 of the structure 2 is exposed. At this time, the nitride liner 16 is replaced with a lower quality liner 26 (i.e., second liner 26), such as, an oxide liner, e.g., a silicon dioxide liner. For example, the liner can include conformal PECVD oxide.

Figure 8:
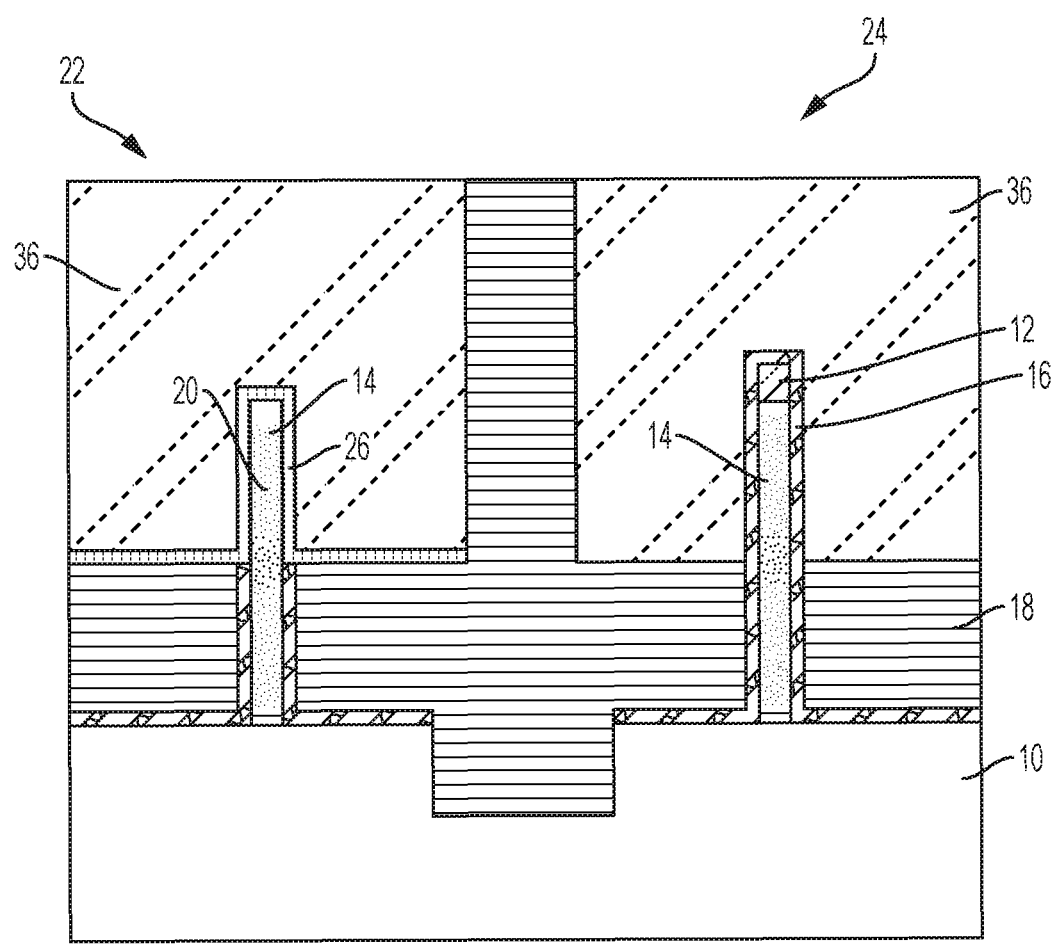
FIG. 8 is a cross-sectional illustration of the finFET structure of FIG. 7 with a dummy gate formed on the finFET structure according to embodiments of the present invention.
Figure 9:
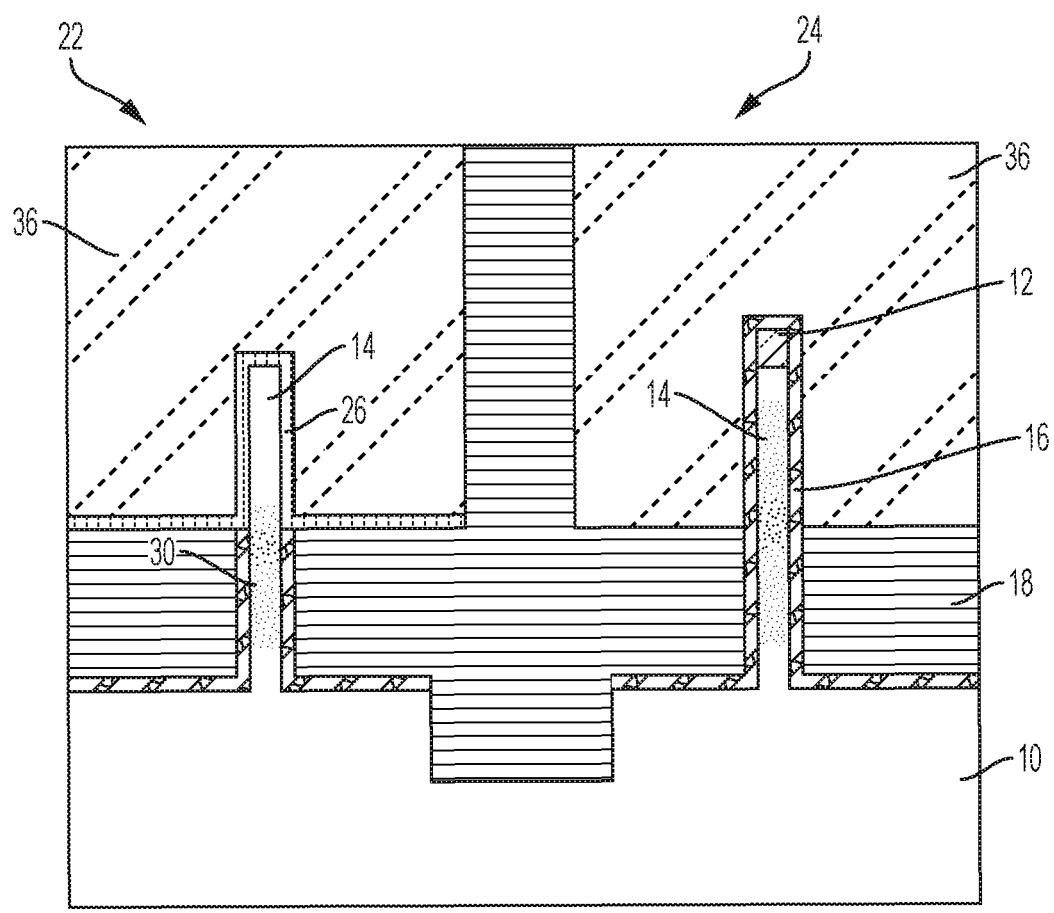
FIG. 9 is a cross-sectional illustration of the finFET structure of FIG. 8 with a second liner formed around a fin in the low threshold region of the finFET structure according to embodiments of the present invention.

FIG. 8 illustrates a view of the structure 2 following the formation of a sacrificial gate 36 over channel regions of the fins 14. The sacrificial gate 36 is formed by depositing a layer (not shown) of sacrificial gate material such as, for example, amorphous silicon (aSi), or polycrystalline silicon (polysilicon) material or another suitable sacrificial gate material. The sacrificial gate 36 can further include a sacrificial gate dielectric material such as silicon oxide between the fins and aSi or polysilicon material.

The sacrificial gate material is deposited by a deposition process, including, but not limited to, physical vapor deposition (PVD), chemical vapor deposition (CVD), atomic layer deposition (ALD), plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any combination of those materials, is deposited on the layer of sacrificial gate material to form a dummy gate hard mask or sacrificial gate cap (not shown). The hardmask layer is deposited using a deposition process, including, but not limited to, PVD, CVD, PECVD, or any combination thereof. The sacrificial gate material is then etched using an anisotropic etching process (for example, a reactive ion etching process) to form dummy gates using the patterned hardmask layer as the etching mask. Spacers are formed by depositing a layer of spacer material over exposed portions of the fins 14 and dummy gates, where the spacer material is deposited by a deposition process, for example, CVD or atomic layer deposition (ALD). Following the deposition of the layer of spacer material, an anisotropic etching process such as, for example, a reactive ion etching process is performed to remove portions of the layer of spacer material and forms the spacers (not shown).

The source/drain regions 42 (see FIG. 11) are formed by an epitaxial growth process that deposits a crystalline overlayer of semiconductor material onto the exposed crystalline seed material of the exposed fin 14 to form the source/drain regions 42.

Epitaxial materials are grown from gaseous or liquid precursors. Epitaxial materials are grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon is doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or between $2 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer is deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer is deposited from a germanium gas source that is selected from the group consisting of germane, digermane, halogermane, dichlorogermane, trichlorogermane, tetrachlorogermane and combinations thereof. While an epitaxial silicon germanium alloy layer is formed utilizing a combination of such gas sources. Carrier gases like hydrogen, nitrogen, helium and argon can be used.

Figure 10:
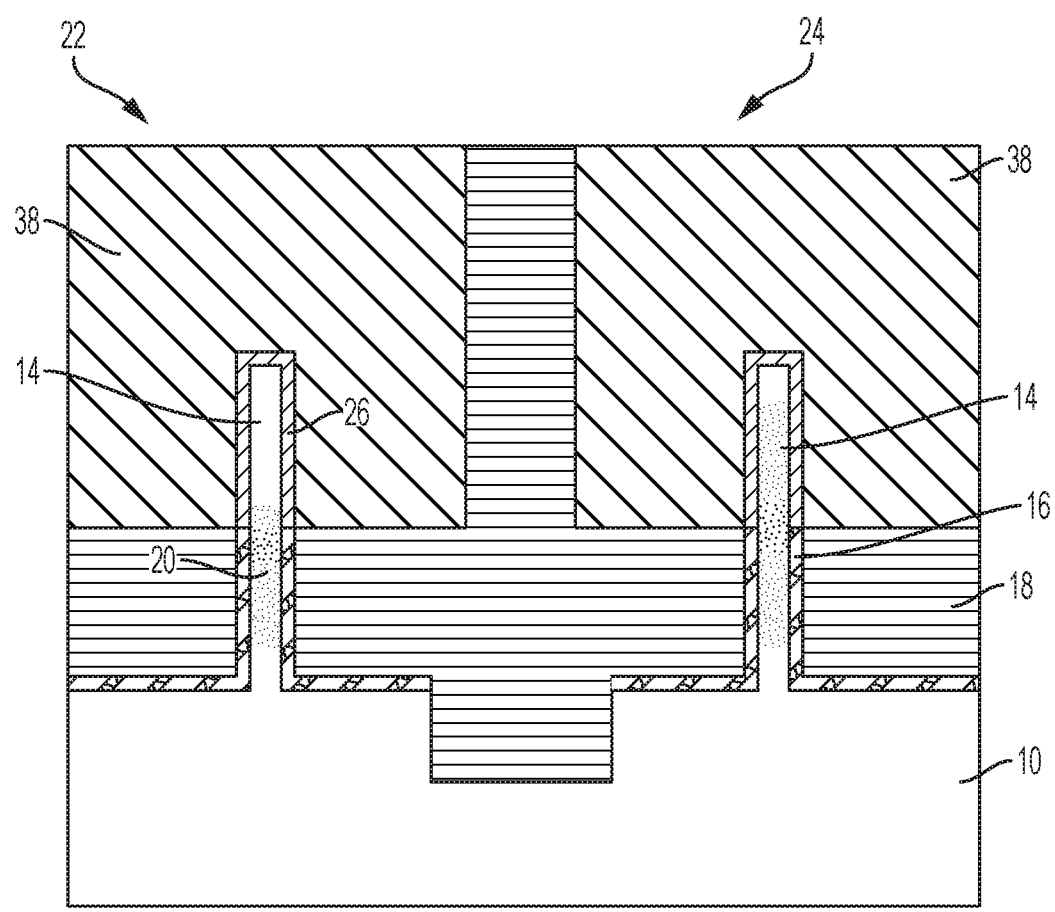
FIG. 10 is a cross-sectional illustration of the finFET structure of FIG. 9 with a replacement metal gate formed on the finFET structure according to embodiments of the present invention.

Following the source/drain epitaxy, an annealing process is performed to drive out the channel dopants 20 into the second liner 26 (e.g., PECVD oxide liner). This process drives out the dopants 20 from the active fins 14 in the low threshold region 22 of the structure and into the second liner 26. In FIG. 10, the sacrificial gate 36 is stripped along with the first liner 16 and the second liner 26. Downstream processes, such as replacement metal gate (RMG) can then be performed.

Turning now to FIG. 10, the formation of replacement metal gate stack (gate stack) 38 to form cavities (not shown) that expose the channel regions of the fins 14 is illustrated.

The sacrificial gates 36 are removed by performing a dry etch process, for example, RIE, followed by a wet etch process. The wet etch process is selective to (will not substantially etch) the spacers 42 (see FIG. 11) and the inter-level dielectric material. The chemical etch process can include, but is not limited to, hot ammonia or tetramethylammonium hydroxide (TMAH).

The gate stack 38 can include high-k metal gates formed, for example, by filling the cavity (not shown) with one or more gate dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) can be disposed over the gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as ruthenium, titanium, palladium, platinum, cobalt, nickel, metal carbides (e.g., hafnium carbide, zirconium carbide, titanium carbide, and aluminum carbide), metal nitrides and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), metal nitrides, aluminides, or any combination thereof. The work function metal(s) can be deposited by a deposition process, for example, CVD, PECVD, PVD, plating, thermal or e-beam evaporation, and sputtering.

The gate conductor material(s) is deposited over the gate dielectric materials and work function metal(s) to form the gate stack. Non-limiting examples of conductive metals include aluminum (Al), platinum (Pt), gold (Au), tungsten (W), titanium (Ti), or any combination thereof. The gate conductor material(s) can be deposited by a deposition process, for example, CVD, PECVD, PVD, plating, thermal or e-beam evaporation, and sputtering.

Following the deposition of the gate dielectric materials, the work function metal(s), and the gate conductor material(s), planarization process, for example, chemical mechanical planarization (CMP), is performed to remove the overburden of the deposited gate materials and form the gate stack.

Figure 11:
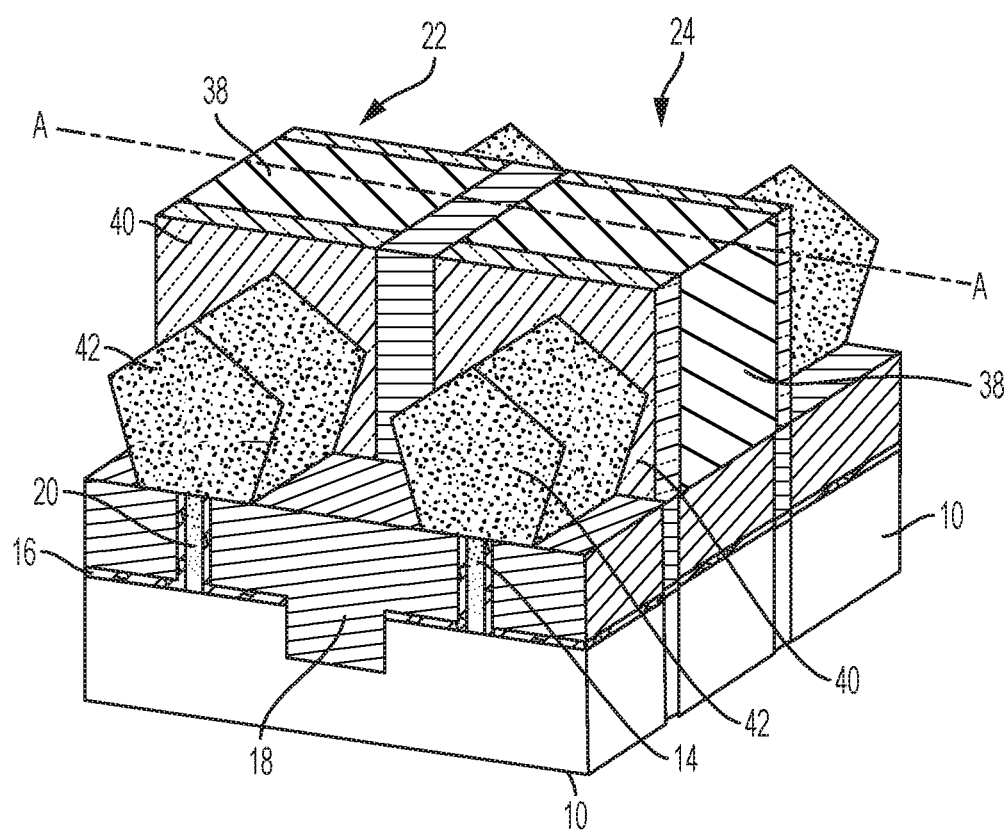
FIG. 11 is a three-dimensional illustration of the finFET structure of FIG. 10.

FIG. 11 is a three-dimensional view of the structure 2 where a first liner 16 (e.g., nitride liner) is formed on the substrate 10 and dopants 20 are present in each fin 14. Shallow trench isolation region 18 is formed around the fins 14. The source/drain region 42 is formed on the shallow trench isolation region 18 on top of the fins 14. The gate stack 38 and spacer 40 are formed over the source/drain region 42. The low threshold voltage region 22 has low channel doping and high performance, while the high threshold voltage region 24 has high channel doping and low leakage.

Figure 12:
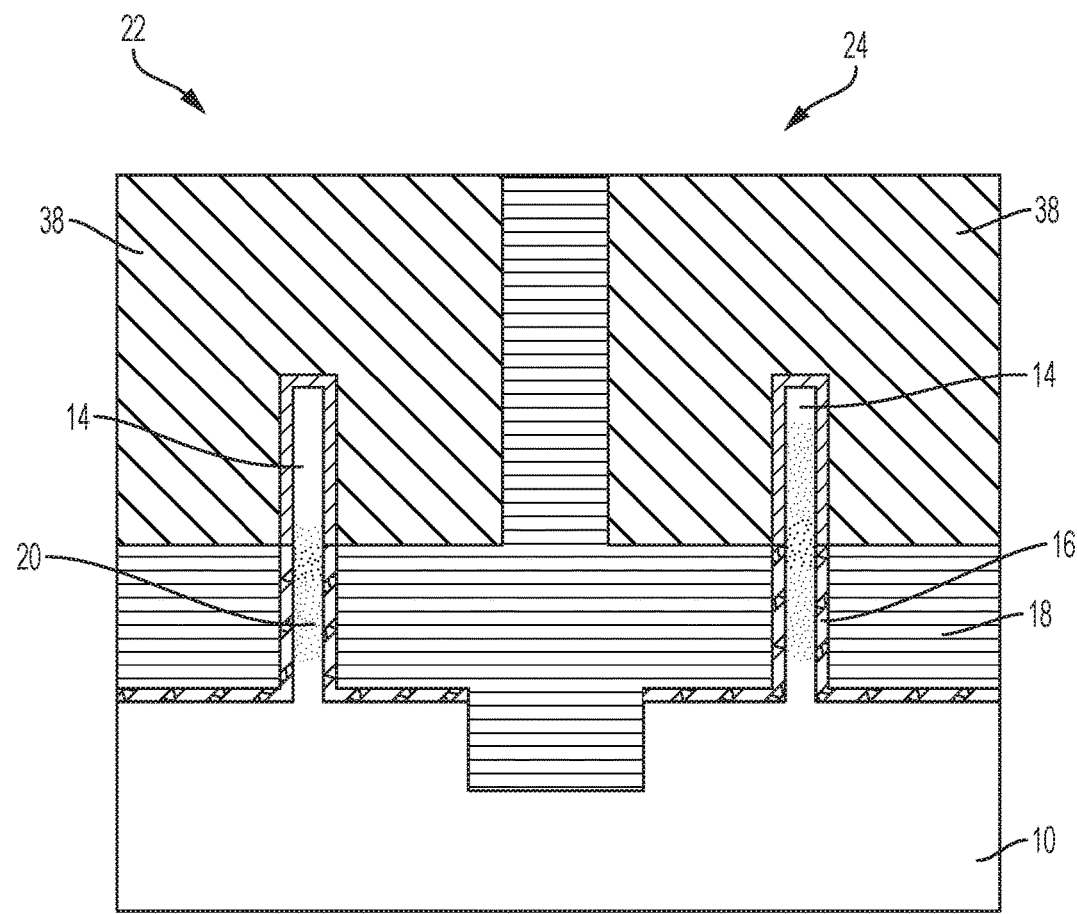
FIG. 12 is a cross-sectional illustration of the completed finFET structure of FIG. 11 taken along line A-A in FIG. 11.

FIG. 12 is a view of the structure 2 of FIG. 11 taken along line A-A in the gate 38 of FIG. 11. As shown in FIG. 12, a first liner 16 (e.g., nitride liner) is formed on the substrate 10 and dopants 20 are present in each fin 14. Shallow trench isolation region 18 is formed around the fins 14. The gate 38 is formed around the fins 14 in the low threshold voltage region 22 and in the high threshold voltage region 24.

Various embodiments are described herein with reference to the related drawings. Alternative embodiments can be devised without departing from the scope of the subject matter described herein. It is noted that various connections and positional relationships (e.g., over, below, adjacent, etc.) are set forth between elements in the following description and in the drawings. These connections and/or positional relationships, unless specified otherwise, can be direct or indirect, and the present subject matter is not intended to be limiting in this respect. Accordingly, a coupling of entities can refer to either a direct or an indirect coupling, and a positional relationship between entities can be a direct or indirect positional relationship. As an example of an indirect positional relationship, references in the present application to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming features of a finFET structure, comprising:
    forming fins on a surface of a substrate;
    forming a first liner around each fin;
    forming a shallow trench isolation region around each fin;
    implanting a dopant layer in each fin;
    etching a portion of the shallow trench isolation region from each fin;
    blocking a first portion of the structure and replacing the first liner with a second liner in a second portion of the structure; and
    annealing the structure to drive the dopants in the dopant layer into the second liner.

2. The method of claim 1, wherein the first liner and the second liner comprise a different material.

3. The method of claim 1, wherein the first liner comprises a material selected from nitride, nitride oxide, or a combination comprising at least one of the foregoing.

4. The method of claim 1, wherein the second liner comprises an oxide.

5. The method of claim 4, wherein the second liner comprises silicon dioxide.

6. The method of claim 1, wherein the second liner is formed onto the structure with by a method selected from chemical vapor deposition, plasma deposition, physical vapor deposition, atomic layer deposition or a combination comprising at least one of the foregoing.

7. The method of claim 6, wherein the method is plasma enhanced chemical vapor deposition.

8. The method of claim 1, wherein the first portion comprises a high threshold voltage region of the structure.

9. The method of claim 1, wherein the second portion comprises a low threshold voltage region of the structure.

10. The method of claim 1, wherein the annealing occurs at a temperature of less than or equal to 900° C.

11. The method of claim 1, further comprising stripping a dummy gate, the first liner, and the second liner from the structure, forming a replacement metal gate and further processing the structure.

12. A finFET structure, comprising:
    a plurality of fins located on a surface of a substrate;
    a first liner disposed around each fin in a high threshold voltage region of the structure, with a dopant layer implanted into each fin; and
    a second liner disposed around each fin in a low threshold voltage region of the structure, with a dopant layer implanted into each fin;
    wherein the first liner and the second liner comprise different materials, and wherein the second liner comprises dopants from the dopant layer.

13. The finFET structure of claim 12, wherein the first liner comprises a nitride.

14. The finFET structure of claim 12, wherein the second liner comprises an oxide.

15. The finFET structure of claim 14, wherein the second liner comprises silicon dioxide.

16. The finFET structure of claim 12, wherein an upper portion of the fins in the first region comprise a substantially low concentration dopants from the dopant layer.

17. A method of forming features of a finFET structure, comprising:
    forming fins on a surface of a substrate;
    forming a first liner comprising a nitride around each fin;
    forming a shallow trench isolation region around each fin;
    removing a fin from the structure;
    implanting a dopant layer in each fin;
    etching a portion of the shallow trench isolation region from each fin;
    blocking a high threshold voltage region of the structure and replacing the first liner with a second liner comprising an oxide in a low threshold voltage region of the structure;
    forming a dummy gate and spacers over a fin;
    performing a source/drain epitaxy to form the finFET structure; and
    annealing the structure to drive the dopants in the dopant layer into the second liner.

* * * * *